US012796010B2

(12) United States Patent
Niebojewski et al.

(10) Patent No.: US 12,796,010 B2
(45) Date of Patent: Nov. 10, 2026

(54) EXCHANGE ELECTRODES FOR NETWORK OF QUANTUM DOTS

(71) Applicant: COMMISSARIAT À L'ÉNERGIE ATOMIQUE ET AUX ÉNERGIES ALTERNATIVES, Paris (FR)

(72) Inventors: Heimanu Niebojewski, Grenoble (FR); Benoit Bertrand, Grenoble (FR); Etienne Nowak, Grenoble (FR)

(73) Assignee: COMMISSARIAT À L'ENERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 389 days.

(21) Appl. No.: 18/538,055

(22) Filed: Dec. 13, 2023

(65) Prior Publication Data

US 2024/0222474 A1 Jul. 4, 2024

(30) Foreign Application Priority Data

Dec. 14, 2022 (FR) ....................................... 2213369

(51) Int. Cl.

| | |
|---|---|
| ***H10D 48/00*** | (2025.01) |
| ***G06N 10/40*** | (2022.01) |
| ***H10D 30/40*** | (2025.01) |

(52) U.S. Cl.

CPC ........... *H10D 48/383* (2025.01); *G06N 10/40* (2022.01); *H10D 30/402* (2025.01); *H10D 48/3835* (2025.01)

(58) Field of Classification Search

CPC ............. H10D 48/383; H10D 48/3835; H10D 30/402; G06N 10/40

See application file for complete search history.

(56) References Cited

U.S. PATENT DOCUMENTS

| | | | |
|---|---|---|---|
| 2018/0331108 A1 | 11/2018 | Hutin et al. | |
| 2019/0123183 A1 | 4/2019 | Hutin et al. | |
| 2019/0392352 A1 | 12/2019 | Lampert et al. | |

OTHER PUBLICATIONS

French Preliminary Search Report for French Patent Application No. 2213369 dated Jun. 29, 2023.

Bashir et al., "A Single-Electron Injection Device for CMOS Charge Qubits Implemented in 22-nm FD-SOI", IEEE Solid-State Circuits Letters, vol. 3, 2020.

T. Bédécarrats et al., "A new FDSOI spin qubit platform with 40 nm effective control pitch", IEDM 2021.

*Primary Examiner* — Molly K Reida

(74) *Attorney, Agent, or Firm* — McDonald Hopkins LLC

(57) ABSTRACT

A quantum electronic device comprising: a substrate coated with at least one semiconductor block, insulation zones on either side of the semiconductor block, front gate electrodes on regions of the semiconductor block each forming a quantum dot, one or more exchange electrodes arranged around and at a distance from the semiconductor block, at least one first exchange electrode among the exchange electrodes being provided so as to allow to modulate a tunnel barrier between a first quantum dot and a second quantum dot, this first exchange electrode being formed by a first conductive pad passing through an insulating layer covering the semiconductor block, the insulation zones and the gate electrodes, the first conductive pad having a "lower" end disposed in contact with the first insulation zone.

15 Claims, 11 Drawing Sheets

EXCHANGE ELECTRODES FOR NETWORK OF QUANTUM DOTS

CROSS-REFERENCE TO RELATED APPLICATIONS

This application claims priority from French Patent Application No. 2213369 filed on Dec. 14, 2022. The content of this application is incorporated herein by reference in its entirety.

TECHNICAL FIELD AND PRIOR ART

The present application relates to the field of quantum electronic devices with quantum bits (also called qubits or Qbits), formed from regions of semiconductor quantum dots and using, besides "front" control gate electrodes located above the dots, one or more exchange electrodes to allow a coupling between two dots or between a dot and a charge reservoir.

Quantum dots form basic elements of a quantum electronic device. Quantum dots are typically formed in a region of semiconductor material in which potential wells are implemented to confine carriers, electrons or holes, in the three dimensions of space. A piece of quantum information is thus encoded via the spin of the carrier. These are thus called spin qubits.

The quantum devices with spin qubits formed using a semiconductor region have the advantage of allowing a manufacturing of a significant density of qubits and of being able to co-integrate these qubits with other components, for example such as transistors.

According to one approach, electrons are confined by field effect under gate electrodes similar to those of the structures of transistors and the piece of information is encoded in the spin of these electrons. These "front" gates are disposed above the quantum dots.

To allow improved control and be able to carry out a tunnel coupling between neighbouring dots and thus be able to modify a tunnel barrier between these neighbouring quantum dots, additional electrodes, called exchange electrodes, can be provided.

Thus, the document "A Single-Electron Injection Device for CMOS Charge Qubits Implemented in 22-nm FD-SOI" by Bashir et al., IEEE SOLID-STATE CIRCUITS LETTERS, VOL. 3, 2020, provides for example an additional upper electrode formed above the gate electrodes and at the first metal level of interconnections in order to control the tunnel coupling between two adjacent dots.

The effectiveness of such an additional electrode, in terms of modulation of potential that it allows to carry out, turns out to be insufficient. This is due in particular to the too-great distance between the additional electrode located in the first metal level and the semiconductor layer or "active zone" in which the qubits are formed.

This is also due to an electrostatic shielding effect because the gates are located in the stack between the additional electrode at the first metal level and the active zone.

The document "A new FDSOI spin qubit platform with 40 nm effective control pitch", by T. Bédécarrats et al., IEDM 2021 also provides exchange electrodes called "J-gates" to control the tunnel coupling between two adjacent quantum dots. These exchange electrodes are this time in the form of conductive pads disposed above and facing the active zone. The control of the coupling between dots is improved insofar as the lower end of the pads is moved closer but the implementation of such electrodes poses problems of costs and difficulties of positioning the pads. It is indeed difficult to dispose these pads at a distance from the active zone sufficiently small to improve the coupling while avoiding coming in contact with the gate electrodes and the dots themselves. An effect of "shielding" by the gates persists with this configuration.

The problem of creating a new quantum device with one or more exchange electrodes and which is improved with respect to at least one of the disadvantages mentioned above thus arises.

DISCLOSURE OF THE INVENTION

According to one aspect, the present invention relates to a quantum electronic device comprising:

- a substrate coated with at least one semiconductor block, said semiconductor block extending mainly in a first direction, said semiconductor block comprising a semiconductor layer,
- insulation zones arranged on either side of the semiconductor layer of said semiconductor block,
- a plurality of front gates, each front gate comprising a part extending on regions of the semiconductor layer of said semiconductor block, each of said regions forming a quantum dot,
- one or more exchange electrodes, said one or more exchange electrodes being arranged facing and above one of said insulation zones and each exchange electrode is provided with a lower end in contact directly with an insulating material of this insulation zone or disposed on this insulation zone.

Such an arrangement of the exchange electrode allows to move closer to the active zone and consequently to the adjacent dots or to the quantum dot and to the dopant reservoir without undergoing an effect of screening of the front gates. With such exchange electrodes, improved control of the tunnel barrier between adjacent dots or between quantum dot and dopant reservoir can thus be obtained.

The creation of such exchange electrodes can also be carried out without risking creating contact on the semiconductor block.

Advantageously, at least one exchange electrode or each exchange electrode can be formed by a conductive pad or conductive via, in other words by a conductive element extending vertically or orthogonally to a main plane of the substrate and provided with an end corresponding to said lower end. The exchange electrode(s) is or are preferably located outside of a zone called "active zone" formed by the semiconductor block. In other words, the exchange electrode(s) are located outside of a vertical projection of the semiconductor block.

The exchange electrode(s) is or are preferably located outside of a zone called "active zone" formed by the semiconductor block but as close as possible to the latter.

Advantageously, the exchange electrode(s) are located on the same side of the substrate as the front gates. In other words, the exchange electrode(s) are not disposed at the rear of the substrate.

Advantageously, the exchange electrode(s) are made of a material that is not doped.

Advantageously, at least one front gate or each front gate comprises another part extending on one of the insulation zones.

Advantageously, at least one exchange electrode or each exchange electrode is disposed between two of said front gates.

The device can be provided with at least one first exchange electrode out of said exchange electrodes extending above the first insulation zone and at a distance from a first region of said semiconductor block forming a first quantum dot, the first exchange electrode being provided at a distance from a second region of said semiconductor block forming a second quantum dot and so as to allow to modulate a tunnel barrier between said first quantum dot and said second quantum dot.

The first exchange electrode can be formed by a conductive pad, said second conductive pad having a "lower" end disposed in contact with the second insulation zone or with an insulating material formed on said second insulation zone. The conductive pad typically passes through an insulating layer covering said semiconductor block and said insulation zones.

According to one possible embodiment, said second region of said semiconductor block forms a second quantum dot, the first exchange electrode being juxtaposed with a part of said semiconductor block arranged between said first region and said second region of said semiconductor block.

According to one possible embodiment, a second exchange electrode is arranged above a second insulation zone and is situated at a distance from said first region forming a first quantum dot and from said second region forming a second quantum dot, the second exchange electrode being configured to modulate the tunnel barrier between said first quantum dot and said second quantum dot, said second exchange electrode being formed by a second conductive pad, said second conductive pad having a "lower" end disposed in contact with the second insulation zone or with an insulating material formed on said second insulation zone.

According to one possible embodiment, the first exchange electrode is arranged between a first gate block and a second gate block, the first gate block and the second gate block extending mainly in a second direction orthogonal to the first direction.

According to one possible embodiment, the device can further comprise at least one other exchange electrode to modulate the tunnel barrier between the second quantum dot and a third quantum dot formed in a third region of the semiconductor block, the other exchange electrode being formed by a third conductive pad passing all the way through, the third conductive pad having a lower end in contact with the first insulation zone or the second insulation zone or an insulating material disposed on the first insulation zone or the second insulation zone.

According to one possible embodiment for which the third conductive pad can be disposed above and facing the first insulation zone and form a third exchange electrode, the device further comprises a fourth exchange electrode to modulate the tunnel barrier between the second quantum dot and a third quantum dot, the fourth exchange electrode being formed by a fourth conductive pad above and facing said second insulation zone.

According to one possible embodiment for which the first exchange electrode is provided to control the tunnel barrier between the first quantum dot and the second quantum dot, the device can be further provided with at least one additional exchange electrode provided to modulate a tunnel barrier between one of said quantum dots and a charge reservoir.

According to one possible embodiment, said lower end of each exchange electrode can be in contact with an etch stop layer or a dielectric layer in which insulating spacers of the front gates are formed.

Advantageously, the device can further comprise charge reservoirs formed on or in said semiconductor block, the charge reservoirs being arranged on either side of said front gates.

Advantageously, the device can further comprise a plurality of charge reservoir electrodes, each charge reservoir electrode contacting a charge reservoir formed on or in said semiconductor block.

According to one possible embodiment, the substrate is a substrate of the semiconductor on insulator type, said semiconductor block thus being formed in a surface semiconductor layer of the substrate.

According to another possible embodiment, the substrate is a bulk semiconductor substrate.

The semiconductor block can be formed by etching of a surface semiconductor layer of the substrate or by etching of a semiconductor layer deposited on this substrate, or by growth on this substrate.

According to another aspect, the present invention relates to a method for manufacturing a quantum electronic device as defined above.

According to another aspect, the present invention relates to a method for manufacturing a quantum device comprising, in this order, steps involving:

- forming on a substrate a semiconductor block, and insulation zones on either side of the semiconductor block, then
- forming gate blocks on the semiconductor block, then,
- forming one or more exchange electrodes by:
  - depositing an insulating layer covering the semiconductor block, the insulation zones and the gate blocks
- creating one or more openings, at least one first opening passing through the insulating layer and reaching the first insulation zone or an insulating material formed on the first insulation zone
- depositing at least one conductive material in the openings.

The method can further comprise, before the formation of the insulating layer, steps of:

- depositing at least one dielectric layer,
- etching the dielectric layer on end portions of the semiconductor block arranged on either side of all of the gate blocks and so as to preserve said dielectric layer on a central portion of the semiconductor block and form insulating spacers against the gate blocks.

According to one possible embodiment of the openings, said insulating material formed on the first insulation zone is that of said dielectric layer.

According to one possible embodiment, the method can further comprise, before the formation of the insulating layer and after the etching of the dielectric layer, the formation of doped regions on the end portions of the semiconductor block arranged on either side of all of the gate blocks.

According to one possible embodiment of the method, among the openings, at least one opening exposes a doped region of the semiconductor block, The creation of the exchange electrode(s) can thus be concomitant to the creation of contacts on the charge reservoirs.

BRIEF DESCRIPTION OF THE DRAWINGS

The present invention will be better understood upon reading the description of exemplary embodiments given, for purely informational and non-limiting purposes, while referring to the appended drawings in which.

Figure 1:
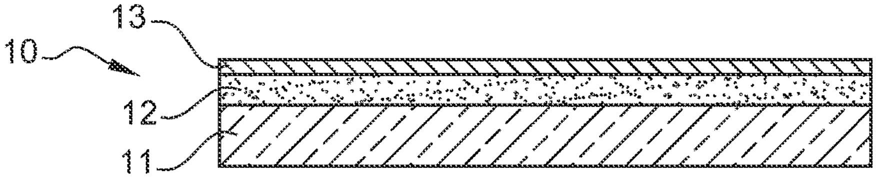
FIG. 1 illustrates an example of a possible starting substrate for implementing a quantum device according to the invention.

Identical, similar or equivalent parts of the various drawings carry the same numerical references so as to facilitate the passage from one drawing to the other.

The various parts shown in the drawings are not necessarily shown according to a uniform scale, to make the drawings more readable.

Moreover, in the following description, terms that depend on the orientation of the structure such as “above”, “below”, “rear”, “front”, “peripheral” apply while considering that the structure is oriented in the manner illustrated in the drawings.

DETAILED DISCLOSURE OF SPECIFIC EMBODIMENTS

Reference is made first of all to FIG. 1 which gives an example of a possible starting material for the creation of a quantum device according to the invention and which is here in the form of a substrate 10 of the semiconductor on insulator type.

The substrate 10 thus includes a supporting layer 11 made of semiconductor material, a buried insulating layer 12 disposed on the support layer 11 and a semiconductor surface layer 13 disposed on the insulating layer. The substrate 10 is typically an SOI substrate, the surface layer 13 of which is made of silicon, in particular $^{28}Si$ when this layer receives quantum dots forming electron-spin qubits.

The insulating layer 12 and the support layer 11 are typically, respectively, a layer made of silicon oxide usually called “BOX” (for Buried Oxide) and a semiconductor layer, for example containing silicon. The thickness of the surface layer 13 is for example between 5 nm and 50 nm, typically approximately 10 nm. The thickness of the buried insulating layer 12 is for example between 15 nm and 150 nm.

Other semiconductor materials are possible for the surface semiconductor layer 13. For hole-spin qubits, silicon can also be used or, according to one alternative, a heterostructure of the relaxed SiGe/stressed germanium/relaxed SiGe type can be chosen, the layer of hole qubits being that made of germanium.

Then, in the surface layer 13, at least one active zone pattern can be defined, here in the form of a semiconductor block 14, typically having an oblong or fin shape, for example parallelepipedic, and which extends mainly in a first direction. This can be done by photolithography and etching of the surface layer 13, in particular plasma etching with stoppage on the insulating layer 12.

Insulation zones 15A, 15B are then formed on either side of the active zone. The insulation zones 15A, 15B can be of the STI type (for Shallow Trench Isolation). The insulation zones 15A, 15B for example contain silicon oxide. The insulation zones 15A, 15B can be made by etching then depositing of insulating material. This can be followed by an optional planarisation to remove a thickness of insulating material and place the upper faces of the insulation zones 15A, 15B at the same level or substantially at the same level as the upper face of the semiconductor block 14.

Figure 2A:
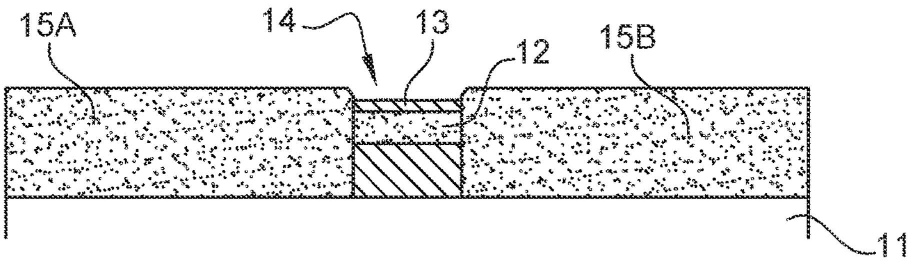
FIGS. 2A and 2B illustrate an embodiment of a semiconductor fin in which a plurality of quantum dots are intended to be formed.
Figure 2B:
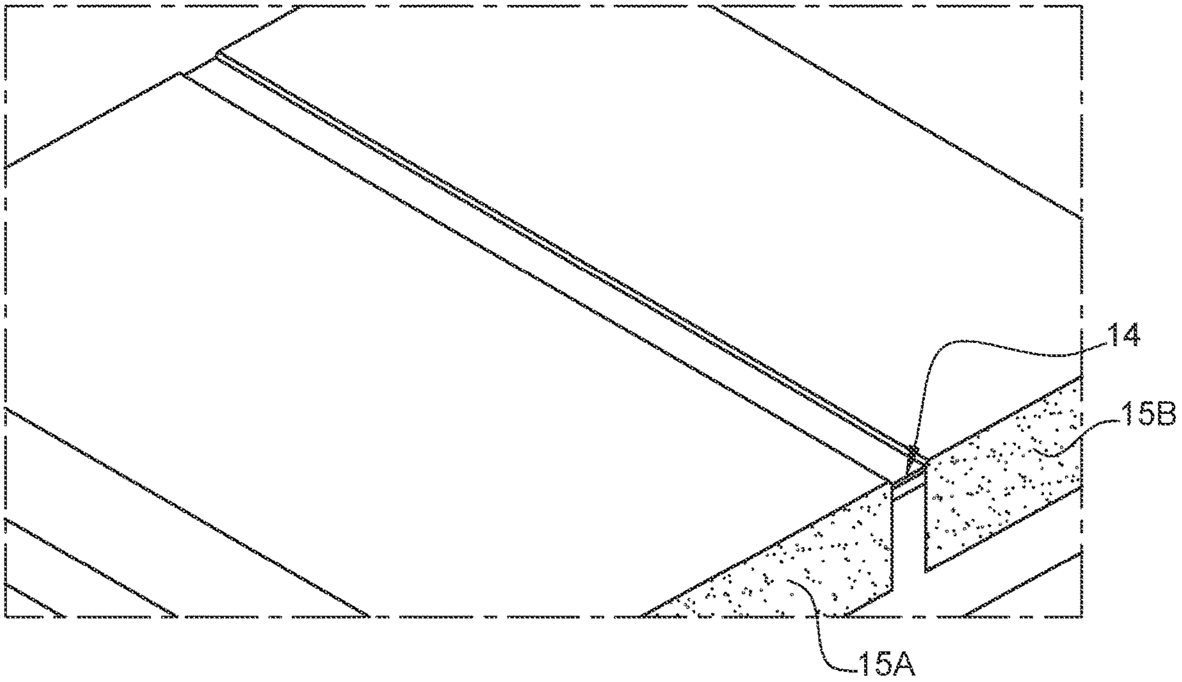

In the specific exemplary embodiment illustrated in FIGS. 2A, 2B (respectively giving a cross-sectional view and a perspective view), a small difference in level, for example of between 0 and 20 nm, is provided between on the one hand the upper faces of the insulation zones 15A, 15B and on the other hand the upper face of the semiconductor block 14.

A gate stack covering the semiconductor block 14 and the insulation zones 15A, 15B is then created. This stack is typically formed by at least one layer of gate dielectric and one or more layers of doped and/or metal semiconductor gate material(s).

For example the gate dielectric is formed by a silicon oxide. A “high-k” dielectric, in other words having a high dielectric constant k, such as for example $HfO_2$ can also be used. There can be a metal layer such as for example TiN above which there is a layer of doped polysilicon above the dielectric itself to form the gate materials.

The gate stack can be coated with at least one masking layer, in particular with at least one hard mask layer typically formed by at least one insulating layer, for example made of SiN and/or made of $SiO_2$.

A plurality of masking blocks **24*a*, 24*c*, 24*d*, 24*e* are then defined by etching in the masking layer in order to create a plurality of distinct blocks 22*a*, 22*b*, 22*c*, 22*d*, 22*e* in the gate stack. Anisotropic etching in particular using a plasma are carried out to create the masking blocks 24*a*, 24*b*, 24*c*, 24*d*, 24*e*, then the distinct gate blocks 22*a*, . . . , 22*e*** under the latter and reproducing the patterns of the latter.

Figure 3A:
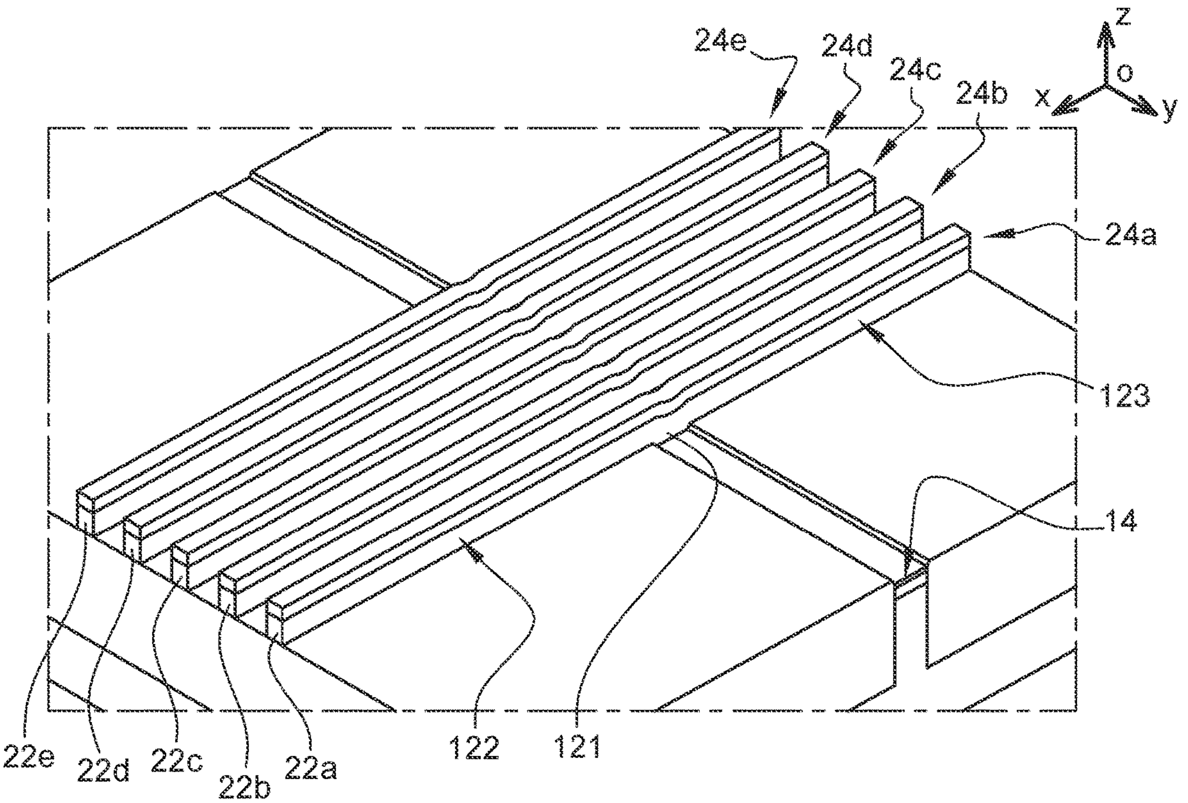
FIGS. 3A, 3B and 3C illustrate an implementation of a plurality of electrostatic control gates of the quantum dots.
Figure 3B:
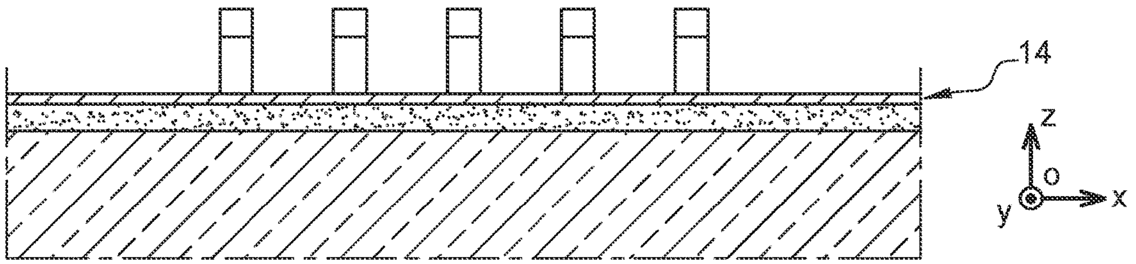
Figure 3C:
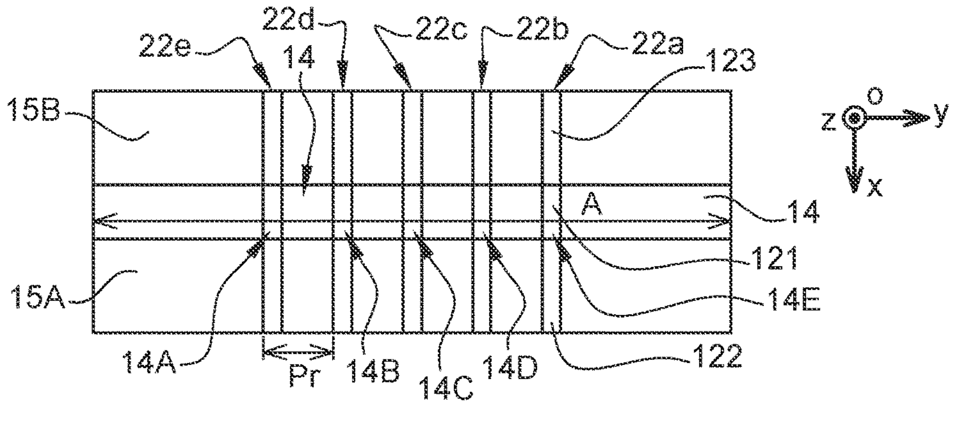

A structure obtained after this step is illustrated in FIGS. 3A, 3B, respectively giving a perspective view, a cross-sectional view along an axis A (given in the top view of FIG. 3C). The gate blocks **22*a*, . . . , 22*e* each have in this example the shape of a parallelepipedic fin. These gate blocks 22*a*, . . . , 22*e* typically extend in a direction (measured parallel to the axis x of the orthogonal reference frame [O; x; y; z]) orthogonal to the direction in which the semiconductor block 14 extends. These gate blocks 22*a*, . . . , 22*e* extend here parallel to a main plane of the substrate 10 (in other words a plane passing through the substrate and parallel to the plane [O; x; y]). The gate blocks 22*a*, . . . , 22*e* are preferably regularly spaced apart with a dense distribution, for example such that the distance of distribution Pr is approximately 20 to 100 nm. Each gate block 22*a*, 22*b*, 22*c*, 22*d*, 22*e* comprises a central portion 121 located on a region of the semiconductor block 14, this region being intended to form a quantum dot. Each gate block 22*a*, 22*b*, 22*c*, 22*d*, 22*e* also includes here end portions 123, 122 on either side of the central portion 121 and located respectively on the insulation zone 15B and the insulation zone 15A. In this example there are therefore as many quantum dots 14A, 14B, 14C, 14D, 14**E as gate blocks.

Each gate block can form a "front" gate electrode. Each front gate can be optionally independent and not connected to the other front gates and can thus be controlled independently of the other front gates.

Figure 4A:
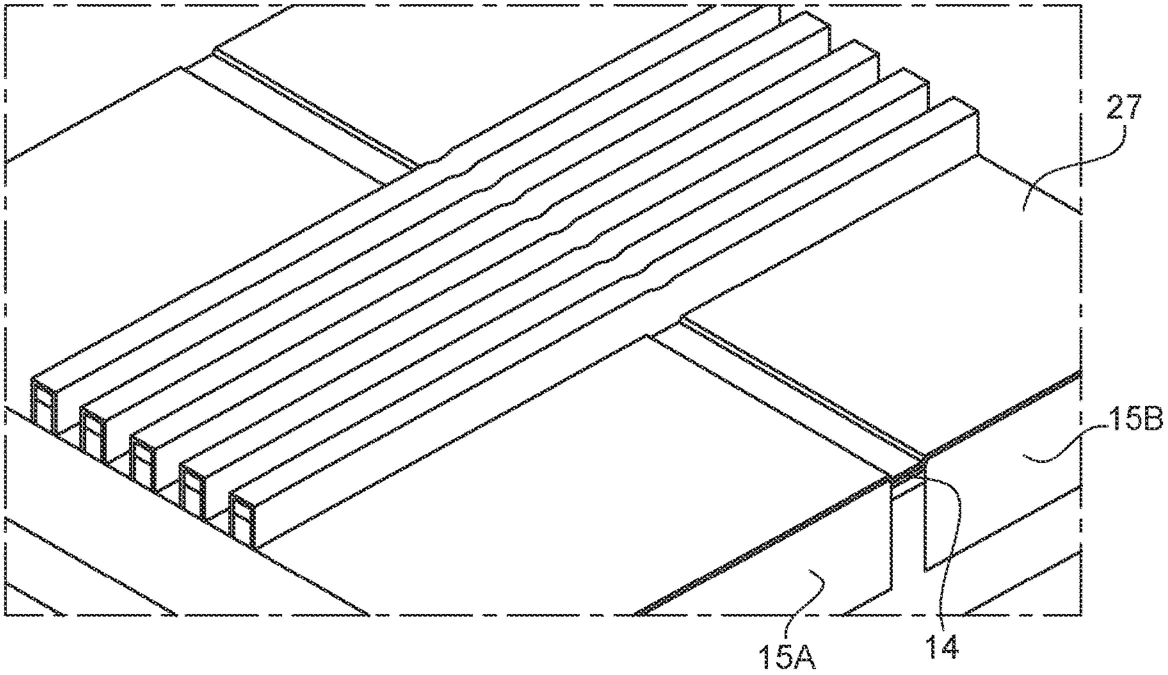
FIGS. 4A, 4B, 5A and 5B illustrate an implementation of a dielectric layer to protect a central portion of the semiconductor fin in which the quantum dots are formed.
Figure 4B:
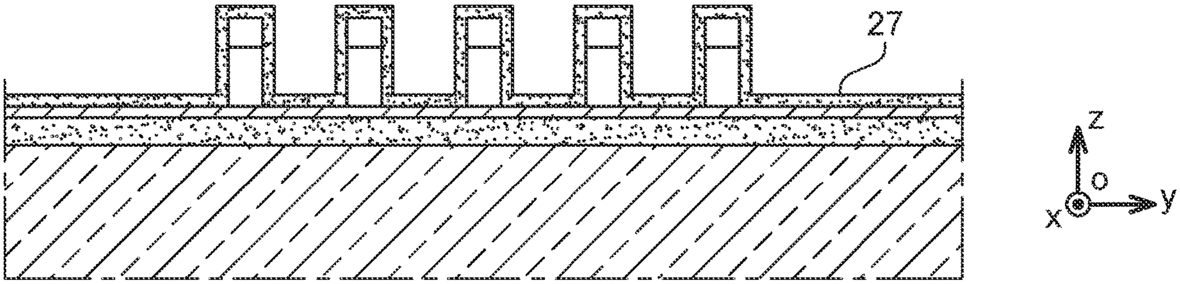

A dielectric mask 27 can then be formed on and between the gate blocks. The dielectric mask 27 can be made here by deposition of a dielectric layer, carried out so as to cover the semiconductor block 14, the gate blocks 22*a*, . . . , 22*e* and the spaces between the gate blocks 22*a*, . . . , 22*e*. In the example illustrated in FIGS. 4A, 4B (respectively giving a perspective view, a cross-sectional view along the longitudinal axis A), the dielectric mask 27 also covers the insulation zones 15A, 15B.

The material of the dielectric mask 27 is for example chosen from one of the following materials: SiO2, SiN, SiCO, SiBCN, SiOCN. The method for depositing the dielectric mask 27 is preferably conformal, and in particular of the ALD type (for Atomic Layer Deposition) in order to fill the inter-gate spaces without creating a filling defect.

Figure 5A:
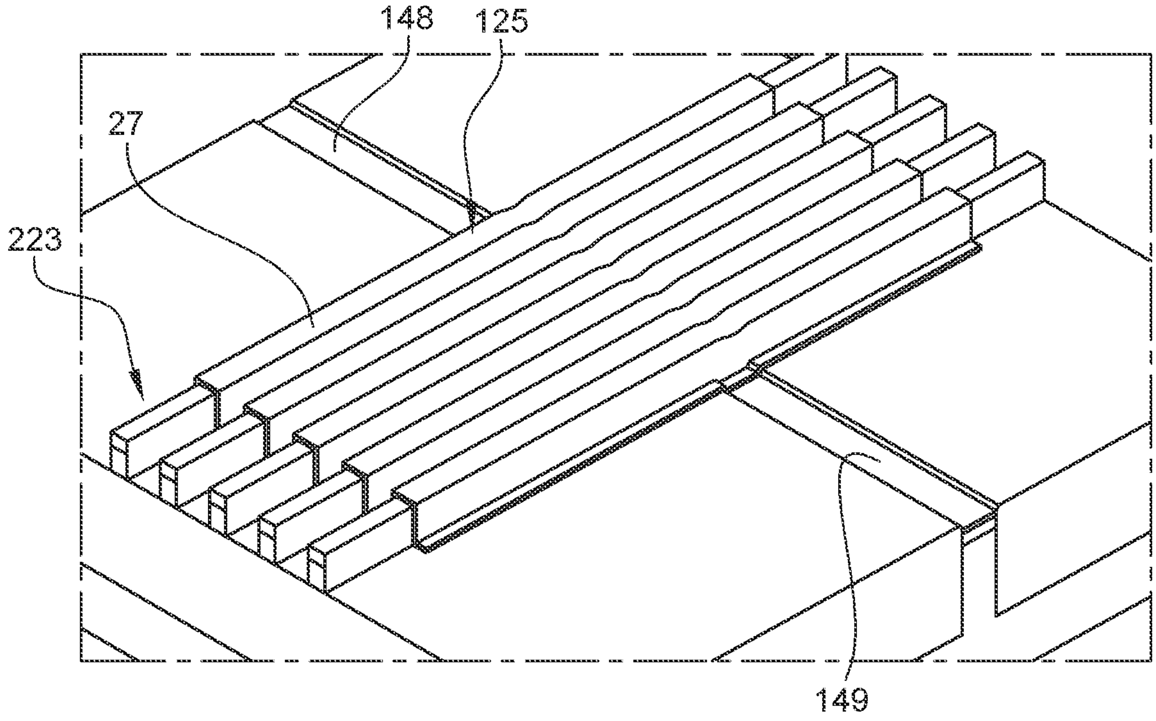
Figure 5B:
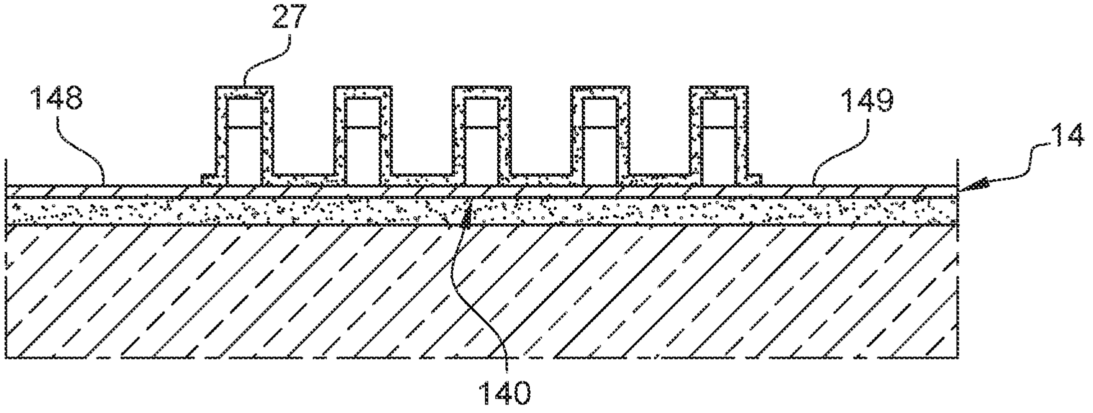

An etching of this dielectric layer is then carried out (FIGS. 5A, 5B respectively giving a perspective view, a cross-sectional view along the longitudinal axis A) so as to only keep the dielectric mask 27 on a region 125 of the gate blocks 22*a*, . . . , 22*e* that comprises the central portion 121 and a part of the end portions 122, 123 of the gate blocks. The dielectric mask 27 is also preserved between the respective regions 125 of these gate blocks 22*a*, . . . , 22*e*.

The dielectric mask 27 is removed from upper faces of end portions 223 of the blocks 22*a*, . . . , 22*e* and of "end" portions 148, 149 of the semiconductor block 14 located on either side of a central portion 140 of the semiconductor block 14 and of all of the gate blocks 22*a*, . . . , 22*e* and which are intended to receive charge reservoirs. The dielectric mask 27 is preserved on a central portion 140 of the semiconductor block 14 in which the dots are intended to be formed.

Figure 6A:
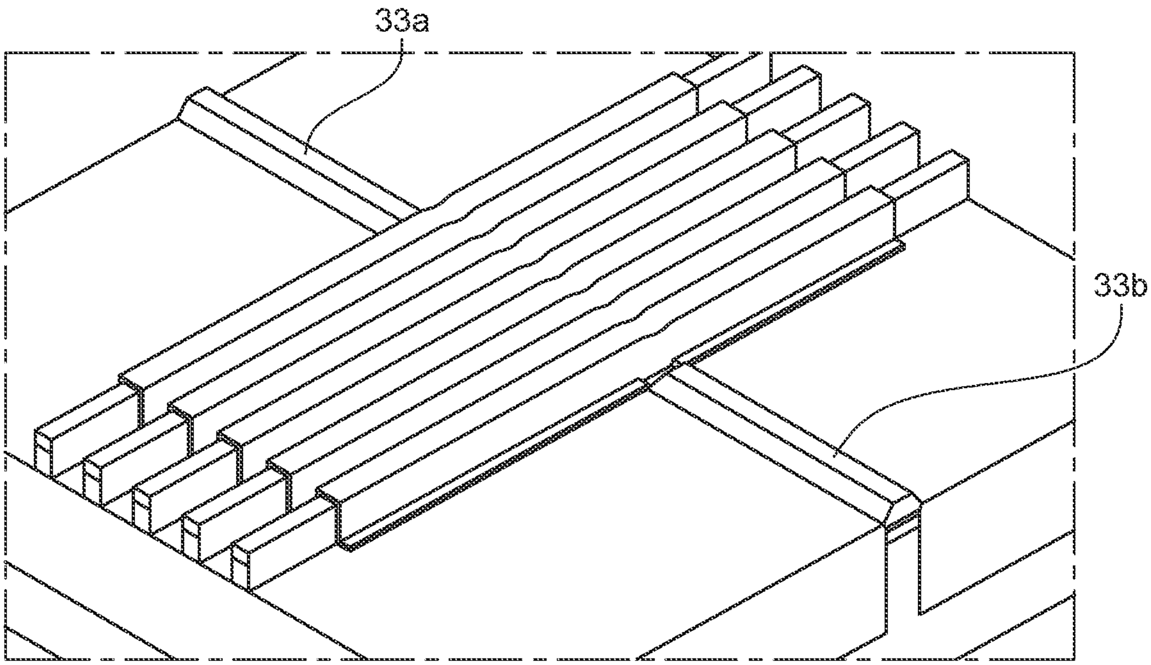
FIGS. 6A and 6B illustrate the implementation of charge reservoirs on the semiconductor fin and on either side of the central portion of the semiconductor fin and of all of the control gates.
Figure 6B:
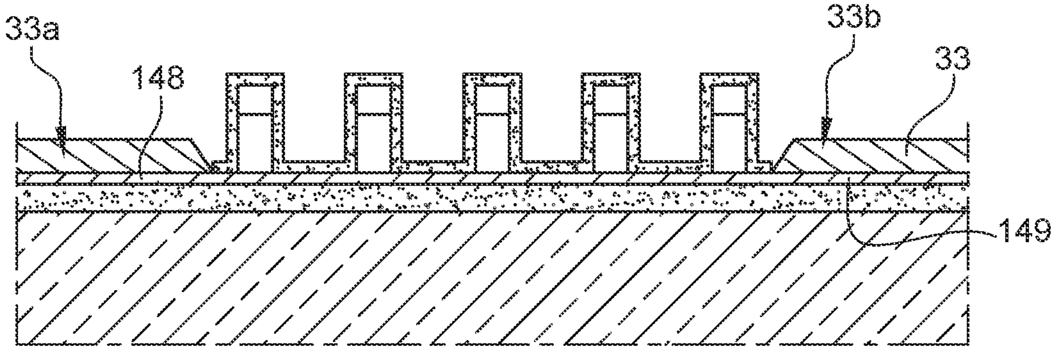

To complete the formation of the charge reservoirs on the portions 148, 149 of the semiconductor block 14, one or more layers of semiconductor material(s) 33 can then be grown by epitaxy on the exposed parts 14', 14" of the semiconductor block 14 (FIGS. 6A and 6B). After etching of the gate blocks 24*a*, 24*b*, 24*c*, 24*d*, 24*e*, in a specific embodiment in which gate dielectric covers the parts 14', 14" of the semiconductor block 14, this gate dielectric layer is removed if necessary before the growth by epitaxy of the charge reservoirs. For this, a step of pre-epitaxy cleaning is typically carried out for example using diluted HF.

An epitaxial growth of silicon or a CVD deposition (for chemical vapour deposition) for example of germanium can in particular be carried out. Doping is then carried out. This doping can be carried out by ion implantation and/or in situ doping carried out concomitantly to the growth of the layer(s) of semiconductor material(s) 33.

For example to form reservoirs 33*a*, 33*b* doped with n-type doping, a growth of Si:P (silicon doped with phosphorus) can be carried out. According to another example, to form reservoirs 33*a*, 33*b* doped with p-type doping, a growth of SiGe:B (silicon germanium doped with boron) can be carried out.

Because in particular of the presence of the dielectric layer 27 on a central portion 140 of the semiconductor block 14, a doping of this central portion 140 is thus avoided, this central portion 140 thus preferably remaining non-doped.

In the case in which one or more ion implantation(s) are carried out to form the reservoirs, a lithographic resin is preferably used to mask the central portion 140 and protect this portion from the implantation(s).

Figure 7:
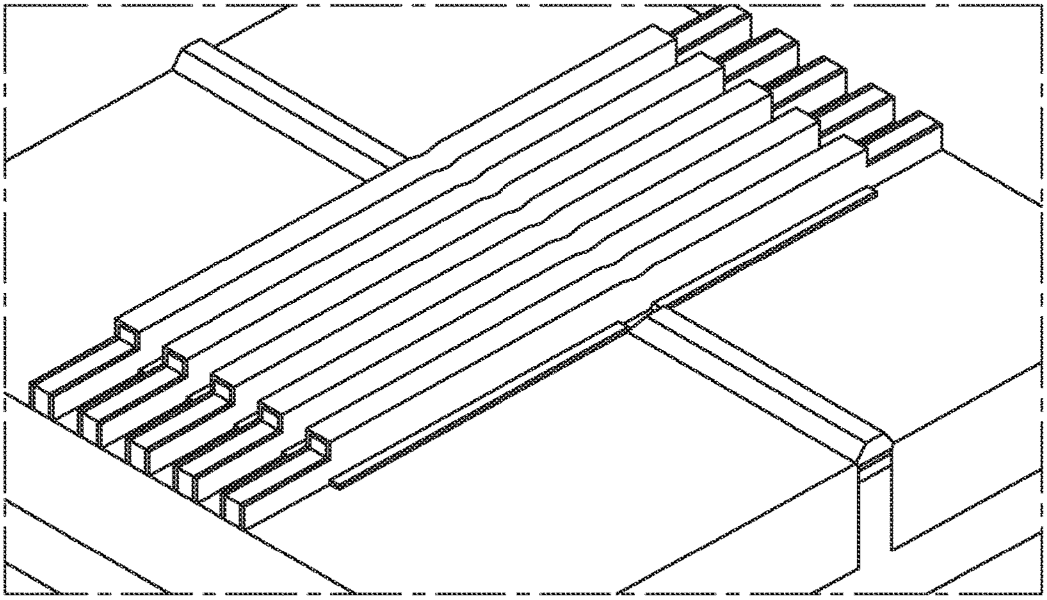
FIGS. 7, 8A and 8B illustrate the implementation of zones of alloy of metal and of semiconductor on the charge reservoirs and the gates in order to form ohmic contacts.
Figure 8A:
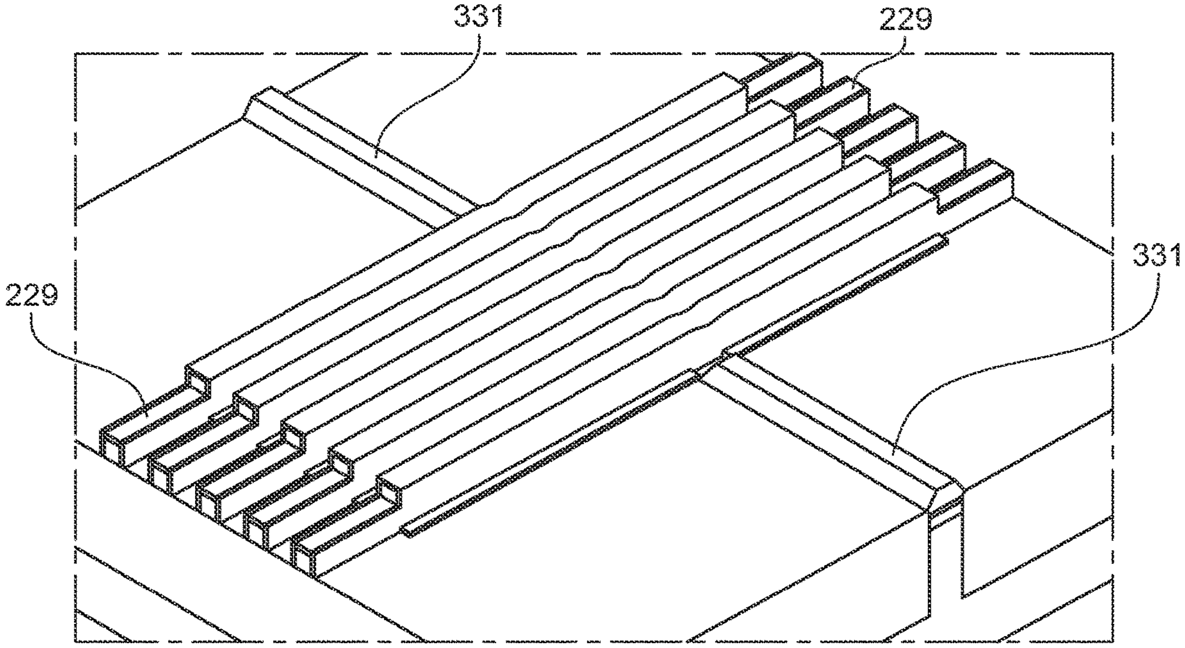
Figure 8B:
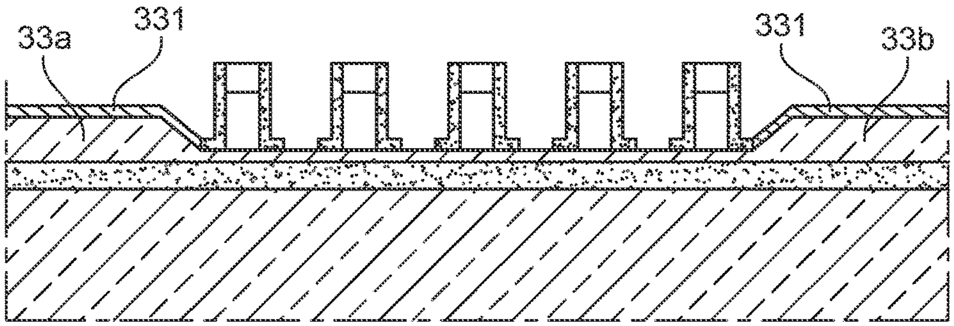

According to an optional step illustrated in FIGS. 7 and 8A-8B, zones 331 containing alloy of metal and of semiconductor can then be formed on the doped reservoirs 33*a*, 33*b*, in order to create ohmic contacts on these reservoirs 33*a*, 33*b*. It is also possible to create zones 229 of alloy of metal and of semiconductor and such ohmic contacts on ends of the gate blocks 22*a*, . . . , 22*e*.

For this, portions of the masking blocks 24*a*, . . . , 24*e* arranged at the ends of the gate blocks 22*a*, . . . , 22*e* are removed (FIG. 7) so as to expose an upper face of these ends.

Then, a step of depositing at least one layer of metal, for example Ni, Pt, W, Co, Ti, or V, can be carried out. The layer of metal can optionally be covered with an encapsulation layer that can be metal. An example of encapsulation is formed by depositing TiN, having a thickness for example of approximately 10 nm.

A heat treatment is then carried out to carry out the siliconising. Such a treatment can be implemented at a temperature of between 200° C. and 900° C. and a duration adapted according to the treatment temperature. A removal of the metal not having reacted can then be carried out for example by wet etching by using a hot solution of the SPM type (for Sulfuric Peroxide Mix). A second siliconising annealing can also be carried out.

In the exemplary embodiment illustrated in FIGS. 8A-8B, regions 331 of alloy of metal and of semiconductor, in particular of silicide are thus formed respectively on the dopant reservoirs 33*a*, 33*b*, while regions 229 of an alloy of metal and of semiconductor (FIG. 8A) are created on the upper ends of the gate blocks 22*a*, . . . , 22*e*.

The quantum device created has here the particularity of being provided with exchange electrodes allowing to implement a quantum coupling between neighbouring or adjacent regions of the semiconductor block 14 each intended for a quantum dot.

Thus, to create such exchange electrodes, at least one insulating layer 50 is first previously formed. The insulating layer 50 formed is provided to cover the semiconductor block 14, said insulation zones 15A, 15B, and the gate blocks 22*a*, . . . , 22*e*.

Figure 9A:
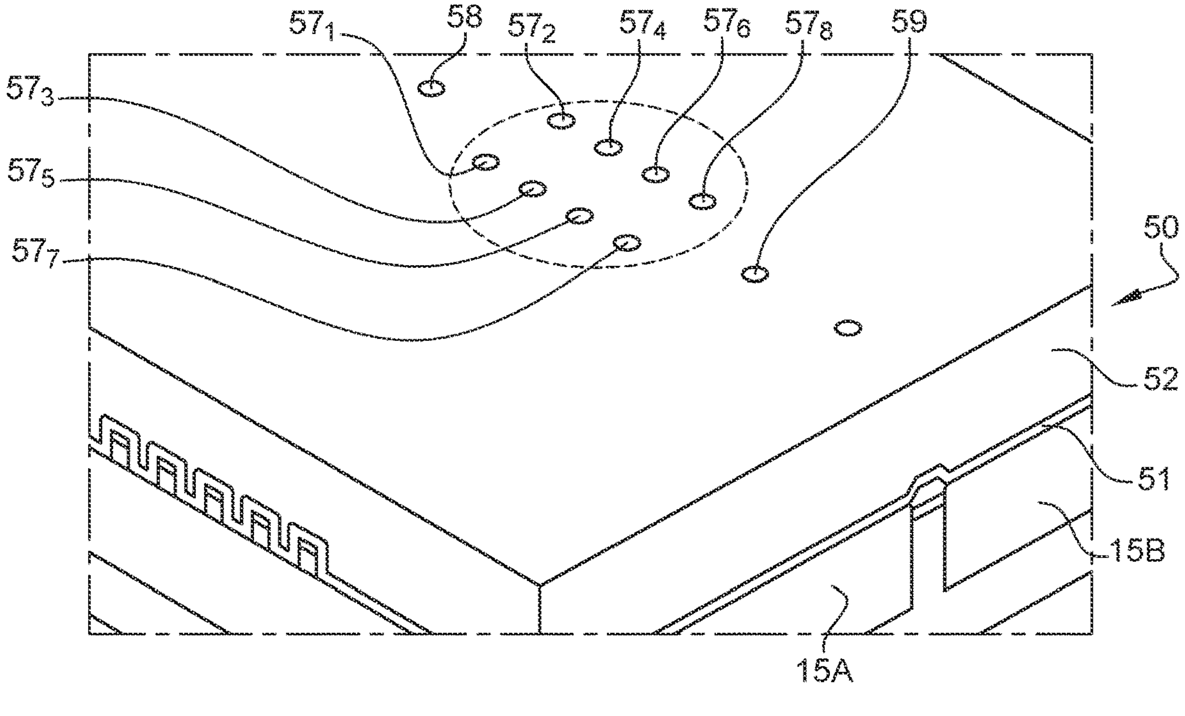
FIGS. 9A to 11 illustrate the formation of exchange electrodes to allow a tunnel coupling between neighbouring quantum dots.
Figure 9B:
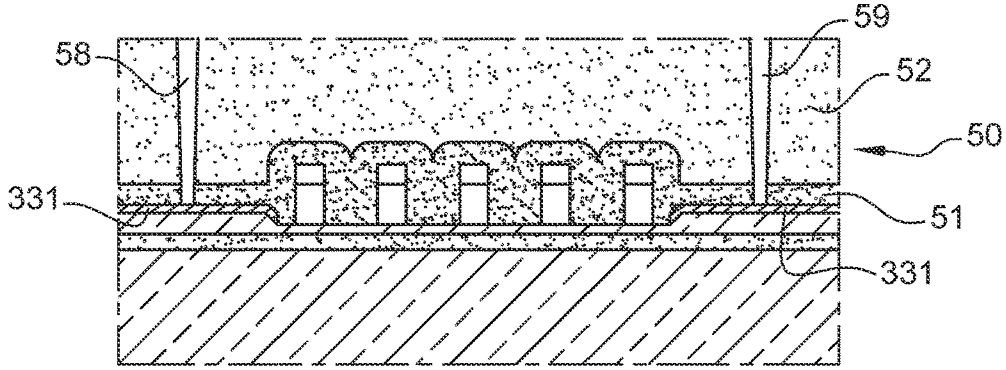
Figure 9C:
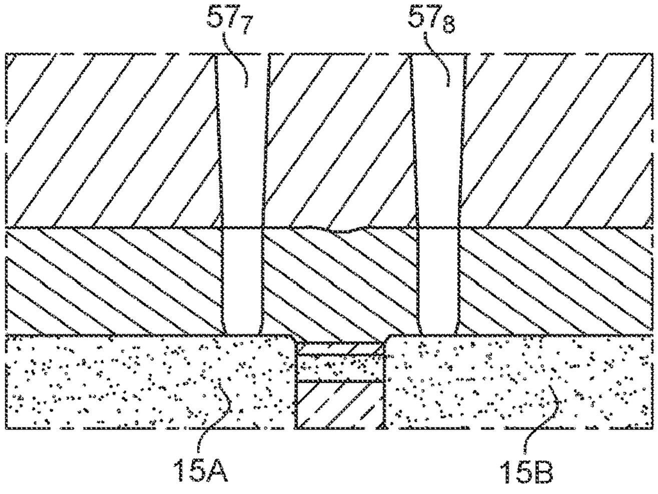
Figure 9D:
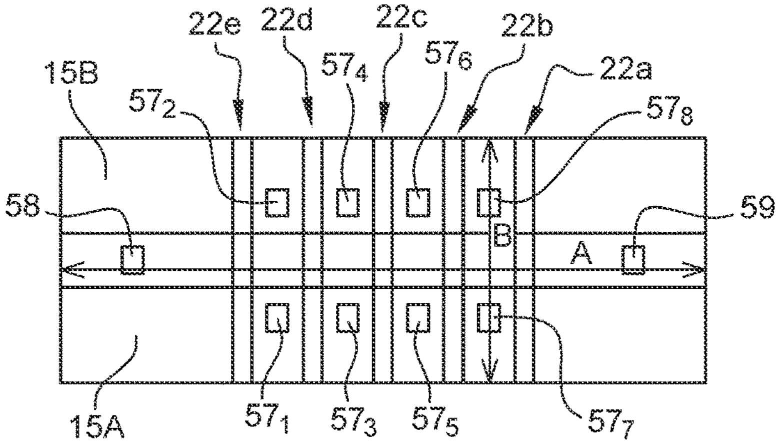

In the exemplary embodiment illustrated in FIGS. 9A, 9B, 9C (respectively giving a perspective view, a cross-sectional view along the longitudinal axis A given in the top view of FIG. 9D, a cross-sectional view along an axis B orthogonal to the axis A), the insulating layer 50 is formed by a stack of several sublayers 51, 52.

A first sublayer 51 made of insulating material, for example silicon nitride, is first of all created and forms here an etch stop layer. A deposition method of the PECVD type (plasma-enhanced chemical vapour deposition) can for example be used to form such a stop layer 51.

A second sublayer 52, for example silicon oxide ($SiO_2$), is created on the first sublayer 51 and forms an encapsulation.

The first sublayer 51 or etch stop layer is preferably chosen made of a material different than that of the second sublayer 52 and of the insulation zones in order to better control the depth of the openings.

One or more openings $\mathbf{57_1}$, $\mathbf{57_2}$, $\mathbf{57_3}$, $\mathbf{57_4}$, $\mathbf{57_5}$, $\mathbf{57_6}$, $\mathbf{57_7}$, $\mathbf{57_8}$ are then made through the insulating layer 50 on either side of the semiconductor block 14. The openings can be made until the insulation zones 15A, 15B are reached. The creation of the openings $57_1$, $57_2$, $57_3$, $57_4$, $57_5$, $57_6$, $57_7$, $57_8$ is carried out typically by photolithography then via one or more etchings carried out through a mask (not shown).

In the exemplary embodiment illustrated in FIG. 9B (giving a cross-sectional view along the axis B), the openings $57_5$, $57_7$ have a bottom located at an upper face, respectively of the first insulation zone 15A and of the second insulation zone 15B.

According to an alternative embodiment (not shown), it is possible to extend these openings into the insulation zones 15A, 15B. The bottom of these openings $57_5$, $57_7$ can then be located in the thickness of the insulation zones 15A, 15B.

According to another possibility, the openings $57_1$, $57_2$, $57_3$, $57_4$, $57_5$, $57_6$, $57_7$, $57_8$ can have a bottom located at an insulating material disposed on the insulation zones 15A, 15B, for example at the masking dielectric layer 27.

In either case, creating the openings $57_1$, $57_2$, $57_3$, $57_4$, $57_5$, $57_6$, $57_7$, $57_8$ facing an insulation zone 15A or 15B rather than above the active zone allows in particular to get closer to the active zone without having to very precisely control the height at which their bottom is located.

In the specific exemplary embodiment illustrated in FIGS. 9A and 9D, the first openings $57_1$, $57_3$, $57_5$, $57_7$ are formed on a first side and at a distance from the semiconductor block 14 and have a bottom exposing the first insulation zone 15A, whereas the second openings $57_2$, $57_4$, $57_6$, $57_8$ are formed on a second side and at a distance from the semiconductor block 14 and have a bottom exposing the second insulation zone 15B. Each opening $57_1$, $57_2$, $57_3$, $57_4$, $57_5$, $57_6$, $57_7$, $57_8$ is in this specific exemplary embodiment disposed between a pair of gate blocks 22*e* and 22*d* (respectively 22*d* and 22*c*, 22*c* and 22*b*, 22*b* and 22*a*).

Advantageously, concomitantly to the creation of the openings $57_1$, $57_2$, $57_3$, $57_4$, $57_5$, $57_6$, $57_7$, $57_8$ for receiving the exchange electrodes, it is possible to create one or more other openings through the insulating layer 50 and in particular openings 58, 59 to create contacts on the dopant reservoirs 33*a*, 33*b*. These openings 58, 59 thus have a bottom reaching the dopant reservoirs 33*a*, 33*b* or the silicided zones formed on these reservoirs.

Conductive pads $67_1$, $67_2$, $67_3$, $67_4$, $67_5$, $67_6$, $67_7$, $67_8$, 68, 69 are then formed by filling the openings $57_1$, $57_2$, $57_3$, $57_4$, $57_5$, $57_6$, $57_7$, $57_8$, 58, 59 using one or more conductive materials (FIGS. 10A, 10B, 10C, 10D). A specific exemplary embodiment provides filling using a stack of Ti, TiN and W.

The conductive pads $67_1$, $67_2$, $67_3$, $67_4$, $67_5$, $67_6$, $67_7$, $67_8$ thus each form an exchange electrode. The conductive pads $67_1$, $67_2$, $67_3$, $67_4$, $67_5$, $67_6$, $67_7$, $67_8$ have a lower end 681 in contact with one of the insulation zones 15A, 15B.

The exchange electrodes $67_1$, $67_2$, $67_3$, $67_4$, $67_5$, $67_6$, $67_7$, $67_8$ are provided to modulate the potential barriers and consequently a tunnel barrier between two adjacent or neighbouring quantum dots near which these exchange electrodes are disposed.

The function of the exchange electrodes $67_1$, $67_2$, $67_3$, $67_4$, $67_5$, $67_6$, $67_7$, $67_8$ is distinct from that of the front gates, these exchange electrodes $67_1$, $67_2$, $67_3$, $67_4$, $67_5$, $67_6$, $67_7$, $67_8$ are not therefore connected to the front gates 22*a*, . . . , 22*e*. The exchange electrodes $67_1$, $67_2$, $67_3$, $67_4$, $67_5$, $67_6$, $67_7$, $67_8$ are not in contact with the semiconductor block 14 in which the dots are formed.

According to the levels of voltages that are applied to them, they thus modulate the quantum coupling between the quantum dots and therefore allow to carry out a control of the exchange energy between neighbouring quantum dots.

As for the conductive pads 68, 69, they act as contacts on the dopant reservoirs 33*a*, 33*b*. Contacts on the charge reservoirs and the exchange electrodes can thus be advantageously created concomitantly, without introducing a specific additional step to create these exchange electrodes, and in particular without an additional lithography step.

Figure 11:
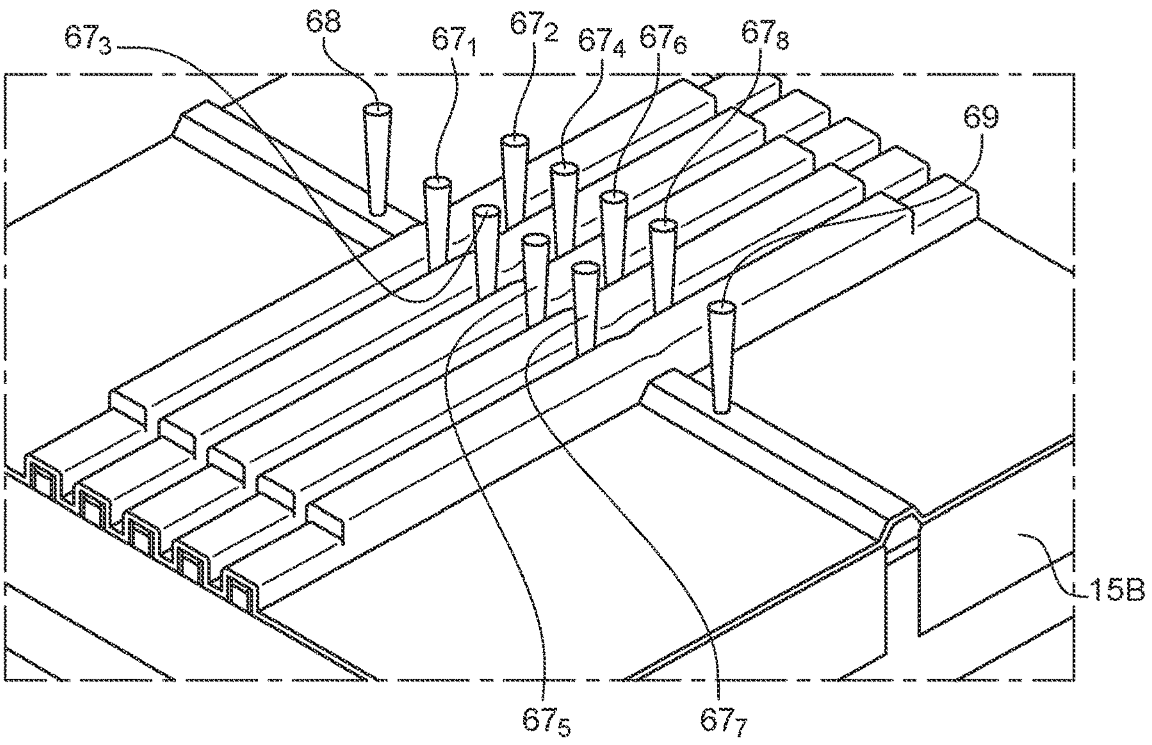

FIG. 11 gives, for reasons of simplification, a cross-sectional view of the device without an upper part of the insulating layer 50 through which the exchange electrodes $67_1$, $67_2$, $67_3$, $67_4$, $67_5$, $67_6$, $67_7$, $67_8$ pass.

Figure 10A:
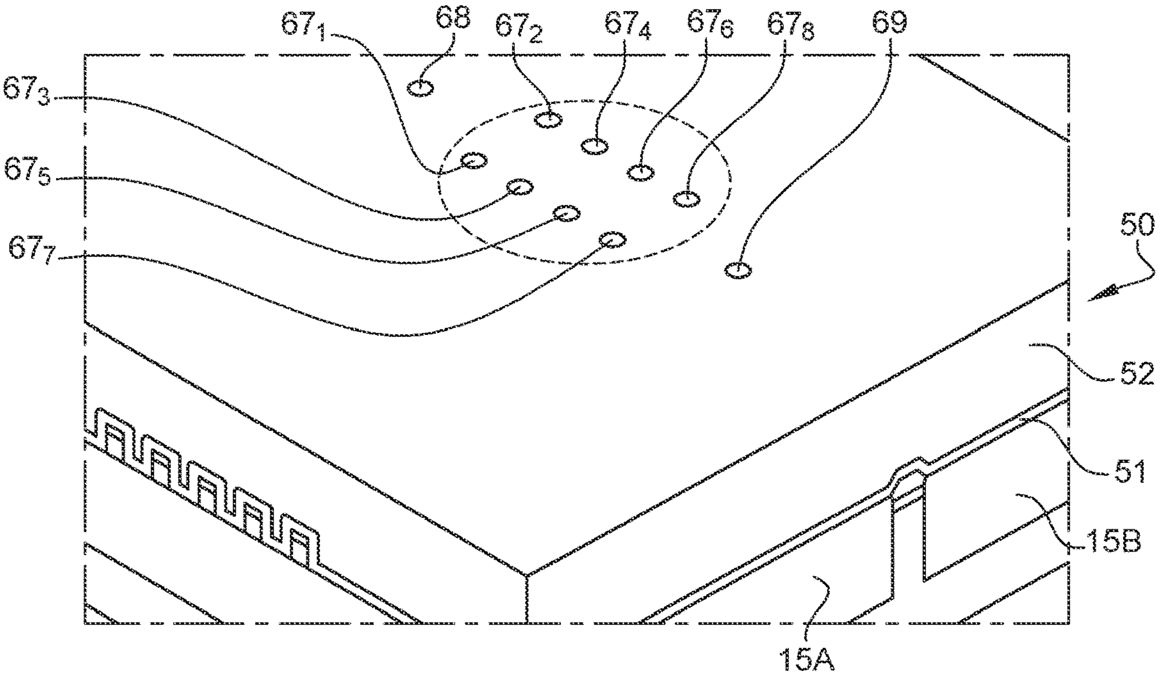
Figure 10B:
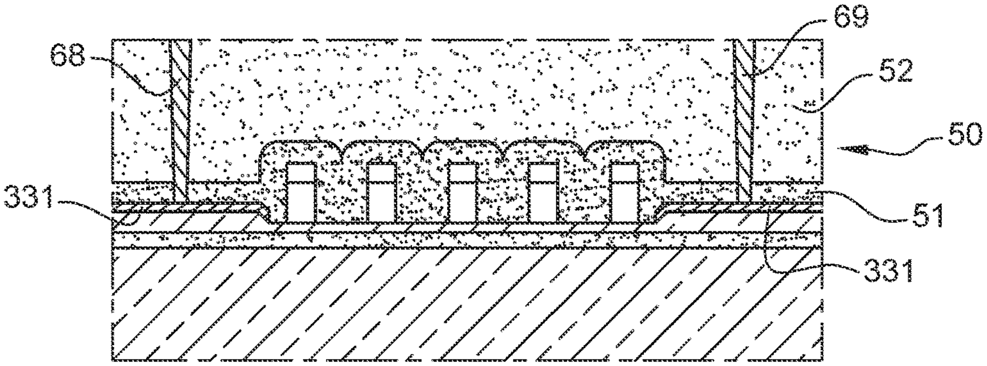
Figure 10C:
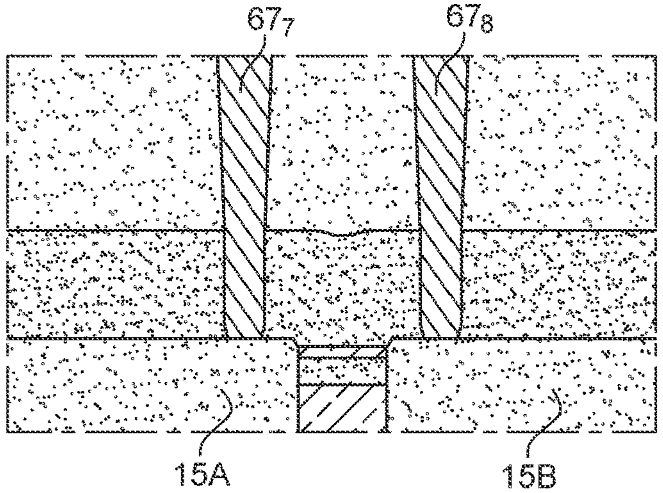
Figure 10D:
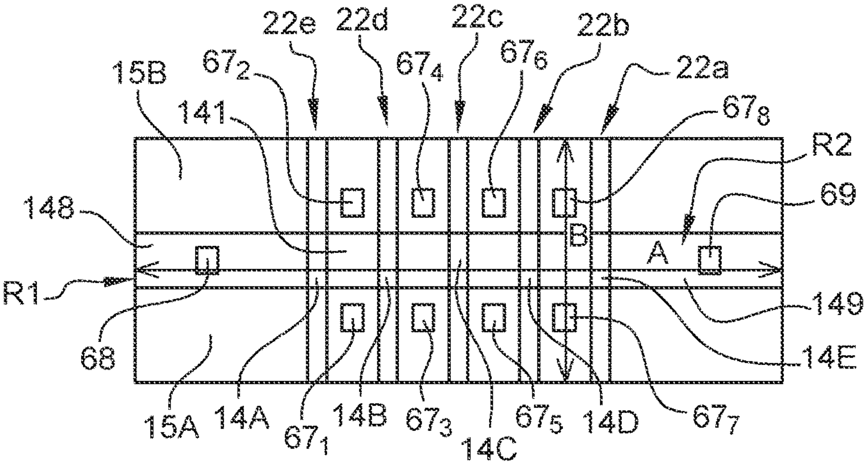

As illustrated in FIG. 10D, the quantum device with spin cubits created includes a first exchange electrode $67_1$ provided near a first region 14A of the semiconductor block 14 forming a first quantum dot and a second region 14B of the semiconductor block 14 forming a second quantum dot. The first exchange electrode $67_1$ allows to modulate the tunnel barrier between the first region 14A forming the first quantum dot and the second region 14B forming the second quantum dot. To dispose the exchange electrode it is aimed to move laterally as close as possible to the active zone in other words to the semiconductor block 14, without entering into contact with this block, nor creating a leak current between the electrode and the active zone. The distance separating the electrode and the active zone must typically guarantee that the leak current measured between these two elements is less than 10 pA, for potential differences between these two elements that can reach up to 5 volts.

"Near" means here at a non-zero distance preferably smaller than 20 nm and typically between 3 nm and 20 nm, preferably 3 nm and 10 nm, advantageously between 3 nm and 5 nm.

Each exchange electrode $67_1$, $67_2$, $67_3$, $67_4$, $67_5$, $67_6$, $67_7$, $67_8$ is positioned at a non-zero minimum distance Δmin from the semiconductor block preferably sufficient to avoid a tunnel current passing between this exchange electrode and the semiconductor block 14. A distance Δmin of at least 3 nm is preferably provided for this.

The first exchange electrode $67_1$ is juxtaposed here with a part 141 of the central portion 140 of said semiconductor block 14, preferably not doped, which is arranged between the first region 14A forming the first dot and the second region 14B forming the second dot. In this specific configuration in which the gate blocks 22*e*, 22*d* respectively protrude from the regions 14A, 14B, the first exchange electrode $67_1$ is arranged between a first gate block 22*e* and a second gate block 22*d*, these gate blocks 22*e*, 22*d* extending mainly in a direction orthogonal to that in which the semiconductor block 14 mainly extends. Such an arrangement also allows to have conductive pads close to the active zone while avoiding an effect of screening of the gates.

A pair of electrodes $67_1$, $67_2$ can advantageously be used to better modulate the tunnel barriers between a pair of neighbouring or adjacent dots.

Thus, in the specific exemplary embodiment illustrated, a second exchange electrode $67_2$ provided on another side of the semiconductor block 14 is also disposed near said first region 14A forming the first quantum dot and the second region 14B forming a second quantum dot. The second exchange electrode $67_2$ arranged above the second insulation zone 15B is also disposed at a given distance from the dots 15A, 15B chosen to allow to better modulate the potential barrier between said first quantum dot and said second quantum dot. The exchange electrode $67_2$ is positioned at a distance Δmin from the semiconductor block sufficient to allow preferably no tunnel current to pass between this electrode $67_2$ and the semiconductor block 14.

The exchange electrodes $67_1$, $67_2$ can be in this case controlled independently of one another, so that the first electrode $67_1$ can be set to a first potential while the second electrode $67_2$ is set to a second potential different than the first potential. Thus, the electrodes $67_1$, $67_2$ can be independent of one another, in other words not connected or not linked to each other, and capable of receiving distinct potentials.

A third exchange electrode $67_3$ and a fourth exchange electrode $67_4$ are disposed here on either side of a part 142 of the semiconductor block 14 located between the second quantum dot and a third dot formed in a third region 14C of this semiconductor block 14. The third exchange electrode $67_3$ and the fourth electrode $67_4$ disposed respectively on the first insulation zone 15A and on the second insulation zone 15B are provided, according to the respective potential that are applied to them, to allow to be able to modulate the tunnel barrier between the second quantum dot formed in the region 14B and the third quantum dot formed in the region 14C.

In the exemplary embodiment illustrated, the electrodes $67_5$, $67_6$ disposed between the region 14C and the region 14D are provided to modulate the tunnel barrier between the neighbouring quantum dots respectively formed in these regions 14C, 14D. Likewise, the electrodes $67_7$, $67_8$ allow to modulate the tunnel barrier between a quantum dot formed in a region 14D and an adjacent quantum dot, here an end quantum dot of the succession or series of dots formed in the central portion of the semiconductor block 14.

Besides one or more exchange electrodes between dots, the quantum device can also be provided with one or more additional exchange electrodes this time between at least one quantum dot 14A or 14E located at an end of the succession of dots 14A, 14B, 14C, 14D, 14E and one of the dopant reservoirs R1, R2 located on either side of this succession of dots and formed in and/or from the semiconductor block 14.

Figure 12A:
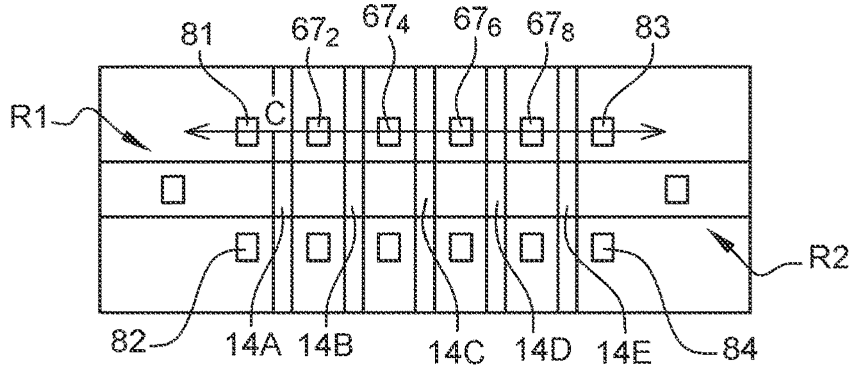
FIGS. 12A and 12B illustrate the creation of exchange electrodes this time between dopant reservoir and quantum dot.
Figure 12B:
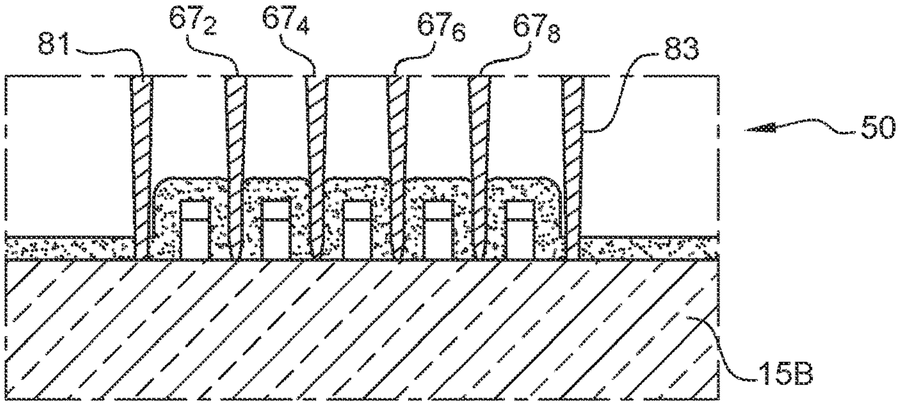

In an exemplary embodiment illustrated in FIGS. 12A, 12B (respectively giving a top view and a cross-sectional view along an axis C), an additional pair of exchange electrodes 81, 82 is provided here to modulate the potential barrier between the first quantum dot 14A and a first dopant reservoir R1 formed in or on an end portion 148 of the semiconductor block 14. Another additional pair of exchange electrodes 83, 84 can also be provided to modulate the potential barrier between this time another end quantum dot 14E and a second dopant reservoir R2 located opposite to the first reservoir R1 in another end portion 149 of the semiconductor block 14.

The additional exchange electrodes 81, 82, 83, 84 are typically formed during the same method steps as the exchange electrodes $67_1$, $67_2$, $67_3$, $67_4$, $67_5$, $67_6$, $67_7$, $67_8$ as described above in relation to FIGS. 9A-9D and 10A-10D.

To create these exchange electrodes 81, 82, 83, 84, openings in particular are formed in the insulating layer 50 each reaching the insulation zone 15A or the insulation zone 15B, then these openings are filled with at least one conductive material to form conductive pads in these openings.

The exchange electrodes 81, 82, 83, 84 are disposed on an insulation zone 15A or 15B and sufficiently close to the dopant reservoir R1 or R2 to, according to the level of potential that is applied to them, allow to modulate the coupling between this dopant reservoir R1, R2 and the end quantum dot 15A, 15E juxtaposed with this reservoir R1, R2.

Figure 13A:
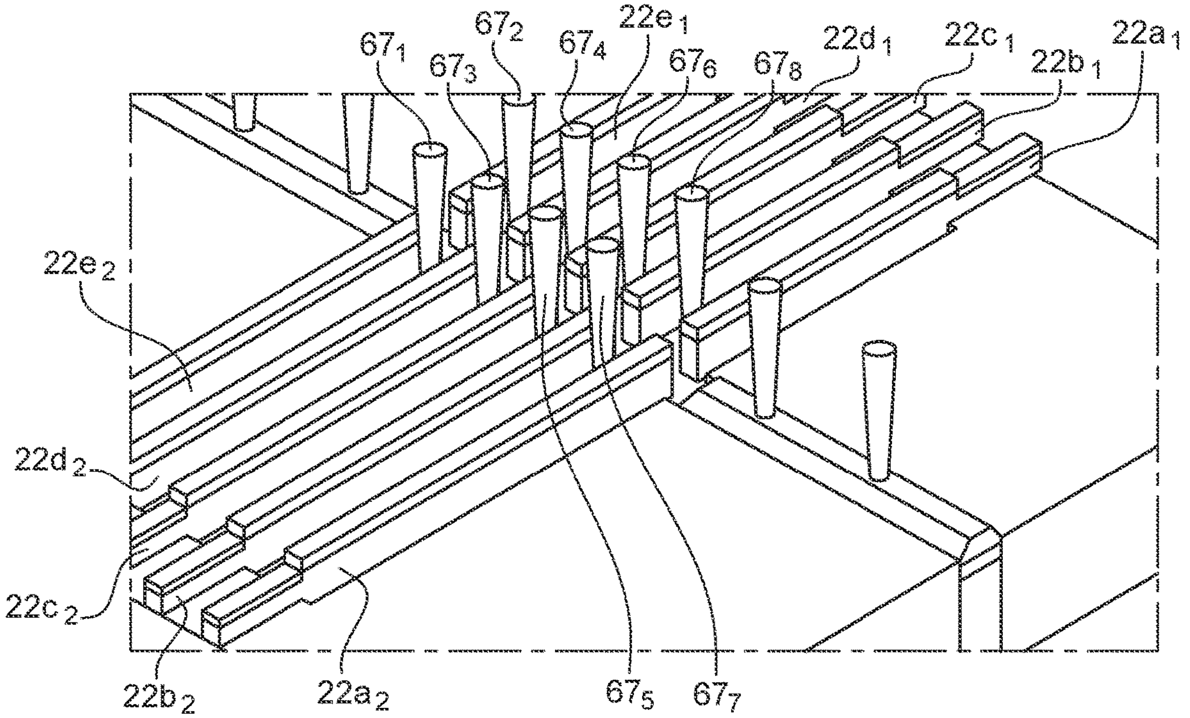
FIGS. 13A and 13B illustrate an alternative embodiment for which a central portion of the semiconductor block is divided into two separate branches, the quantum dots being formed in at least one of said branches.
Figure 13B:
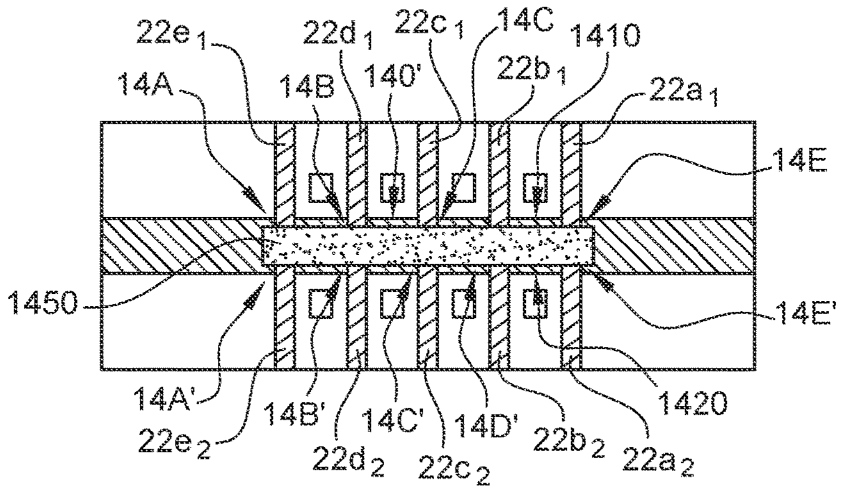

An alternative embodiment is given in FIGS. 13A-13B. The semiconductor block 14 has here a central portion 140' having a configuration different than that described above and formed by a first semiconductor fin 1410 in which a row of quantum dots 14A, 14B, 14C, 14D, 14E is provided and a second semiconductor fin 1420, in which another row of dots 14A', 14B', 14C', 14D', 14E'

The semiconductor bars 1410, 1420 have an oblong shape for example parallelepipedic and are separated from each other via a region 1450 typically made of insulating material.

This configuration of the central portion 140 of the semiconductor block can be obtained by creating a trench in the latter, and this trench can thus be filled with insulating material.

Above each dot of the first row, a front control gate 221 is arranged, and facing this gate 221, above each dot of the second row of detection dots, a control gate 222 is provided.

The dots of the first fin 1410 can be provided to form a first row of data qubits, while the dots of the second fin 1420 can form a second row of detection elements for the reading of an encoded value of the data qubits of the first row.

In either one of the exemplary embodiments described above, the semiconductor block in which the quantum dots are formed is made from the surface layer of a substrate, in particular a semiconductor on insulator substrate. However, it is also possible to start from a different substrate, for example a bulk substrate to form this block.

The semiconductor block(s) in which the quantum dots are formed can also be formed in one or more distinct semiconductor layers of a semiconductor surface layer of a substrate. Thus, according to a possible alternative, the semiconductor block for receiving quantum dots is formed by etching of a pattern created from one or more layers or zones formed by epitaxy.

According to a specific embodiment, the semiconductor block in which the quantum dots are provided can be in the form of a fin and implemented in a manner similar to that in which the semiconductor fin of a transistor of the finFET type is created.

A quantum device implemented according to the invention is not limited to a number of quantum dots and of front gates as given for example in FIGS. 12A-12B. A greater number N (with N an integer that can be greater than 5) of gates and of quantum dots can be provided. In this case, at least N−1 electrodes and preferably N−1 pairs of exchange electrodes disposed between each pair of neighbouring quantum dots are typically provided.

A device as described above can be provided with an electrode circuit for controlling the qubits and is adapted to the implementation on the same substrate of transistors for this control circuit. The transistors of the control circuit can use CMOS technology (Complementary metal-oxide-semiconductor), and in particular cryogenic CMOS, or cryo-CMOS, operating at low temperature and typically less than 1 Kelvin in order to best preserve the quantum states of the qubits.

The invention claimed is:

1. A quantum electronic device comprising:

a substrate coated with at least one semiconductor block, said semiconductor block extending mainly in a first direction, the semiconductor block comprising a semiconductor layer;

insulation zones arranged on either side of the semiconductor layer of said semiconductor block, a plurality of front gates, each front gate comprising a part extending on regions of the semiconductor layer of said semiconductor block, each of said regions forming a quantum dot, each front gate comprising another part extending on one of the insulation zones;

one or more exchange electrodes, to modulate the tunnel barrier between neighbouring quantum dots, said one or more exchange electrodes are arranged between two front gates, facing and above a respective one of said insulation zones, and each exchange electrode is provided with a lower end in contact directly with an insulating material of the respective insulation zone or in contact directly with an insulating material disposed on the respective insulation zone, wherein the first direction is parallel to a direction in which a main plate of the substrate extends, wherein each of the one or more exchange electrodes extends, from said lower end to an opposite upper end, along a second direction orthogonal to the direction in which a main plate of the substrate extends, and wherein each of the exchange electrodes are entirely located outside of a footprint of the semiconductor block that is projected along the second direction.

2. The quantum electronic device according to claim 1, wherein at least one first exchange electrode among said exchange electrodes extends above the first insulation zone and at a distance from a first region of said semiconductor block forming a first quantum dot, the first exchange electrode being provided at a distance from a second region of said semiconductor block forming a second quantum dot and so as to allow to modulate a tunnel barrier between said first quantum dot and said second quantum dot.

3. The quantum electronic device according to claim 2, wherein the first exchange electrode being juxtaposed with a part of said semiconductor block arranged between said first region and said second region of said semiconductor block.

4. The quantum electronic device according to claim 1, comprising at least one second exchange electrode arranged above a second insulation zone and adjacent to said first region forming a first quantum dot and a second region forming a second quantum dot so as to allow to modulate the tunnel barrier between said first quantum dot and said second quantum dot, said second exchange electrode being formed by a second conductive pad having a lower end disposed in contact with a second insulation zone or with an insulating material formed on said second insulation zone.

5. The quantum electronic device according to claim 4, wherein the first exchange electrode is arranged between a first gate covering said first region and a second gate covering said second region, the first gate and the second gate extending mainly in a second direction orthogonal to the first direction facing the first insulation zone.

6. The quantum electronic device according to claim 4, further comprising at least one other exchange electrode to modulate the tunnel barrier between said second quantum dot and a third quantum dot formed in a third region of said semiconductor block, said other exchange electrode being formed by a third conductive pad, said third conductive pad being formed facing and above the first insulation zone or the second insulation zone.

7. The quantum electronic device according to claim 2, wherein the first exchange electrode is provided to control the tunnel barrier between said first quantum dot and said second quantum dot, the device being further provided with at least one additional exchange electrode provided to modulate a tunnel barrier between one of said quantum dots and a dopant reservoir formed on and/or in an end portion of the semiconductor block.

8. The quantum electronic device according to claim 5, wherein a second exchange electrode is disposed between the second gate covering said second region and a third gate, the first exchange electrode and the second exchange electrode being independent of one another and not connected to each other.

9. The quantum electronic device according to claim 1, wherein said lower end of each exchange electrode is in contact with an etch stop layer or a dielectric layer in which insulating spacers of the front gates are formed.

10. The quantum electronic device according to claim 1, wherein said semiconductor block is formed in a surface semiconductor layer of the substrate of the semiconductor on insulator type, or rests on a bulk semiconductor substrate.

11. The quantum electronic device according to claim 1, further comprising charge reservoirs formed on or in said semiconductor block, the device being provided with a plurality of charge reservoir electrodes, each contacting a charge reservoir formed on and/or in said semiconductor block.

12. A method for manufacturing a quantum electronic device, the method comprising, in this order, steps of:

forming on a substrate a semiconductor block, and insulation zones on either side of said semiconductor block, then forming gate blocks on the semiconductor block, said gate blocks extending mainly in a direction orthogonal to a main direction in which said semiconductor block extends, then forming said one or more exchange electrodes by:

depositing an insulating layer covering said semiconductor block, said insulation zones and the gate blocks, creating one or more openings passing through said insulating layer, at least one first opening passing through said insulating layer and being made so as to reach the first insulation zone or an insulating material formed on the first insulation zone, depositing at least one conductive material in said openings, wherein a first direction extends parallel to a direction in which a main plate of the substrate extends, wherein each of the one or more exchange electrodes extends, from a lower end to an opposite upper end, along a second direction orthogonal to the direction in which a main plate of the substrate extends, and wherein each of the one or more exchange electrodes are entirely located outside of a footprint of the semiconductor block that is projected along the second direction.

13. The method according to claim 12, further comprising, before the formation of the insulating layer, steps of:

depositing at least one dielectric layer, etching said dielectric layer on end portions of the semiconductor block arranged on either side of all of the gate blocks and so as to preserve said dielectric layer on a central portion of said semiconductor block and form insulating spacers against the gate blocks.

14. The method according to claim 13, further comprising, after the etching of said dielectric layer and before the formation of the insulating layer, the formation of doped regions on said portions of the semiconductor block arranged on either side of all of the gate blocks.

15. The method according to claim 12, wherein among said openings, at least one other opening exposes a doped region of the semiconductor block or formed on said semiconductor block.

* * * * *